United States Patent [19]

Seto et al.

[11] Patent Number: 4,502,894
[45] Date of Patent: Mar. 5, 1985

[54] METHOD OF FABRICATING POLYCRYSTALLINE SILICON RESISTORS IN INTEGRATED CIRCUIT STRUCTURES USING OUTDIFFUSION

[75] Inventors: John Y. W. Seto; Ken K. Y. Su, both of San Jose, Calif.

[73] Assignee: Fairchild Camera & Instrument Corporation, Mountain View, Calif.

[21] Appl. No.: 522,934

[22] Filed: Aug. 12, 1983

[51] Int. Cl.³ .......................... H01L 21/20; B01J 17/00
[52] U.S. Cl. ..................................... 148/1.5; 29/576 B; 29/577 C; 148/187; 148/188; 148/191; 357/51; 357/59; 357/91
[58] Field of Search ............... 148/1.5, 187, 188, 191; 29/576 B, 577 C; 357/51, 59, 91

[56] References Cited

U.S. PATENT DOCUMENTS

| | | | |
|---|---|---|---|
| 3,892,608 | 7/1975 | Kuhn | 148/188 |
| 4,214,917 | 7/1980 | Clark et al. | 148/1.5 |
| 4,239,559 | 12/1980 | Ito | 148/188 |
| 4,335,505 | 6/1982 | Shibata et al. | 29/577 R |
| 4,351,099 | 9/1982 | Takagi et al. | 29/571 |
| 4,391,032 | 7/1983 | Schulte | 29/571 |
| 4,408,385 | 10/1983 | Mohan Rao et al. | 29/576 B |

OTHER PUBLICATIONS

Ning, IBM-TDB, 23, (1980), 368.

*Primary Examiner*—Upendra Roy
*Attorney, Agent, or Firm*—Townsend and Townsend

[57] ABSTRACT

A process of fabricating a polycrystalline silicon resistor on a semiconductor structure is disclosed. According to the process insulating material is fabricated over selected regions of the semiconductor structure 10, and selected impurity 18 introduced into the insulating material, typically in conjunction with other process operations useful in fabricating semiconductor structures. Undoped regions of polycrystalline silicon 21 are then formed on the surface of the insulating material 15 and the entire structure is treated to cause the dopant in the insulating material 15 to out diffuse into the undoped polycrystalline silicon to thereby create resistors. The treating operation is typically the heat treatment performed in conjunction with other process operations in the fabrication of integrated circuits. In one embodiment the introduction of impurities into the insulating material places the impurities at a depth such that no out diffusion will occur at the selected process parameters except where the field oxide has been selectively thinned using an etching or other known process.

8 Claims, 5 Drawing Figures

METHOD OF FABRICATING POLYCRYSTALLINE SILICON RESISTORS IN INTEGRATED CIRCUIT STRUCTURES USING OUTDIFFUSION

BACKGROUND OF THE INVENTION

1. Field of the Invention

This invention relates to integrated circuit structures and processes for fabricating them, and in particular to a method of fabricating polycrystalline silicon resistors in integrated circuit structures using out diffusion, and the resulting product.

2. Description of the Prior Art

The use of polycrystalline silicon to fabricate interconnections in integrated circuit structures, and to provide resistors for such structures is now well-known. Also well-known are various techniques for fabricating regions of oxidized isolation to electrically isolate individual or groups of active and passive devices from each other. One such technique is taught in U.S. Pat. No. 3,648,125 issued to Douglas L. Peltzer.

In conventional integrated circuit fabrication processes polycrystalline silicon resistors are fabricated in desired locations by the deposition of doped polycrystalline silicon utilizing conventionally available chemical vapor deposition apparatus. According to such techniques doped polycrystalline silicon is deposited across the upper surface of a wafer and then removed from undesired locations using well-known photolithographic and etching techniques. Another well-known technique for fabricating polycrystalline silicon resistors is to deposit undoped polycrystalline silicon and then dope it using ion implantation or diffusion processes. Unfortunately, each of these prior art techniques for fabricating such resistors suffers from the disadvantage of requiring additional process steps to create the resistors. As is well-known each additional process step means higher cost for the final product and provides additional opportunity for defects, misalignment, or other difficulties which reduce the overall yield of functional integrated circuits from such processes. Furthermore, such processes do not take advantage of previous process steps to enable formation of the desired resistors.

SUMMARY OF THE INVENTION

This invention provides a process for manufacturing polycrystalline silicon resistors in integrated circuit structures which does not require additional process steps over those otherwise required to fabricate the remaining regions of the integrated circuit. In particular, the method of this invention provides a technique by which impurities introduced into the surface of the wafer for other purposes may be out diffused into deposited regions of polycrystalline silicon to create the desired resistors. The invention provides accurate control of the resistance of such resistors and enables selection from a wide range of such resistances, depending upon the particular process parameters chosen for fabrication of the remainder of the circuit. Because the invention utilizes process operations which are performed for other purposes, yields of the completed circuit are increased, costs decreased, and the opportunity for defects which lower the performance of the circuit is lessened.

In a preferred embodiment of the invention a method of fabricating a polycrystalline silicon resistor in an integrated circuit structure includes the steps of fabricating insulating material over selected regions of the integrated circuit structure, introducing at least one desired conductivity type dopant into the insulating material, forming regions of undoped polycrystalline silicon on the insulating material, and treating the integrated circuit structure, including the regions of polycrystalline silicon, to cause the dopant in the insulating material to diffuse into the polycrystalline silicon. In the preferred embodiment the dopants are introduced using ion implantation, and the integrated circuit structure is heated during subsequent process operations to cause the dopant to out diffuse into the overlying polycrystalline silicon, to thereby form resistors of desired resistance.

DETAILED DESCRIPTION OF THE PREFERRED EMBODIMENT

Figure 1:
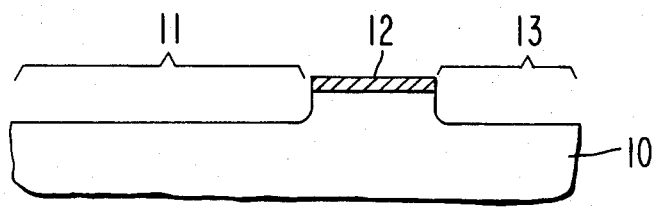
FIG. 1 is a cross sectional view of an integrated circuit structure which may be fabricated using well-known process operations.

FIG. 1 is a cross sectional view of an integrated circuit structure which may be fabricated using conventional process operations. For example, the structure shown in FIG. 1 is an intermediate structure from the process description in U.S. Pat. No. 3,648,125. As that patent more clearly describes, a region of silicon nitride 12, or other desired material is used to protect a portion of the surface of a silicon wafer 10 from an etchant used to remove regions 11 and 13 from the upper surface thereof. As is well-known in the art, regions 11 and 13 serve to define the field regions which will surround desired active and passive devices to be fabricated in silicon 10 beneath nitride layer 12. As will be apparent from the following description, the presence or absence of various active or passive electronic devices in wafer 10 is immaterial to the process of this invention. To avoid complexity the substrate 10 is shown without any electronic devices formed therein, however, as few or as many such devices as desired may be present in substrate 10 without affecting the process of this invention.

Figure 2:
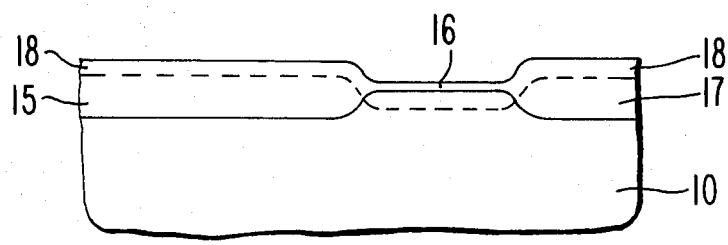
FIG. 2 is a subsequent cross sectional view after oxidation of the structure and implantation of desired impurity.

As next shown in FIG. 2, the structure shown in FIG. 1 is oxidized to create field oxide regions 15 and 17 on substrate 10. Silicon nitride, or other material 12, is removed and the oxidation continued to create a relatively thinner layer oxide 16 over the intermediate portion of wafer 10. The presence of oxide 16 is not critical to the invention, but is included in the Figures to illustrate a typical application of the invention in which it is desired to dope that portion of substrate 10 previously beneath nitride layer 12. As also shown in FIG. 2, a selected impurity, typically one commonly used in semiconductor processing, is implanted across the surface of the wafer to define a region of impurity 18 near the upper surface of oxide 15 and 17, and extending through oxide 16 into substrate 10 as shown. Typically regions 15, 16 and 17 will comprise silicon dioxide formed by heating the substrate in an oxygen ambient until the desired thickness of silicon dioxide is created. Impurity 18 will typically comprise boron, phosphorous, arsenic, antimony, or other well-known dopants used in semiconductor fabrication. Of primary advantage to the process of this invention is the fact that impurity zone 18 is created for purposes other than the fabrication of a polycrystalline silicon resistor. For example, impurity zone 18 may be created to provide a source, drain or channel in substrate 10, or to provide the emitter, collector, or base of a bipolar transistor in substrate 10, or for any other well-known purpose. As evident from FIG. 2, in the selection of appropriate parameters for the ion implantation, the impurity zone 18 may be caused to extend through the relatively thin silicon dioxide 16 into substrate 10, but not the through the thicker silicon dioxide regions 15 and 17. The implant energy and dose necessary to create region 18 are discussed below.

Figure 3:
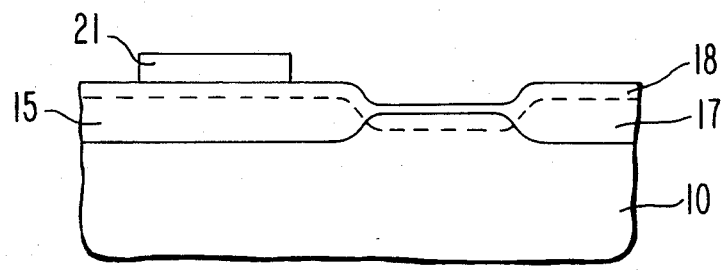
FIG. 3 is a subsequent cross sectional view after formation of a desired region of polycrystalline silicon on the insulating material.

As next shown in FIG. 3 a region of polycrystalline silicon 21 of desired dimensions is formed on the upper surface of the field oxide 15. In the preferred embodiment this is achieved by chemical vapor deposition of a layer of polycrystalline silicon across the entire upper surface of the wafer, followed by selectively removing undesired regions of the polycrystalline silicon using conventional masking and photolithographic process. In the typical embodiment polycrystalline silicon 21 will be 5000 Angstroms thick. Polycrystalline silicon regions 21 will be left on the surface of the wafer at least wherever a polycrystalline silicon resistor is desired.

Figure 4:
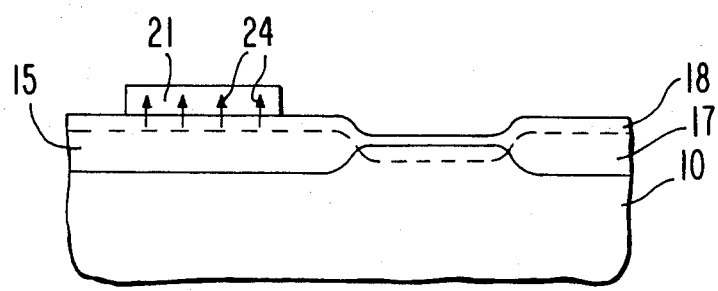
FIG. 4 is a subsequent cross sectional view illustrating out diffusion of the impurities from the insulating material into the polycrystalline silicon.

As next shown in FIG. 4, the entire structure is treated to cause some of the impurity 24 from zone 18 to out diffuse into polycrystalline silicon 21. In this manner the polycrystalline silicon is doped with an appropriate amount of impurity to thereby form a resistor on the surface of insulating material 15. The resistance of the polycrystalline silicon region 21 after the out diffusion process will be determined by the energy of the ion implantation, the dose of impurity implanted, and the parameters of the out diffusion. We have found that at 100 KeV and $6 \times 10^{15}$ arsenic atoms per square centimeter a resistance of 10 gigaohms per square is achieved. At 60 KeV, and the same dose, a resistance of about 100 megaohms per square is achieved. In each case the subsequent process which causes the out diffusion includes a step in which the wafer is heated to a temperature of 1000° C. for 30 minutes. In the preferred embodiment of this invention this treating step is performed in conjunction with other process operations in the fabrication of the integrated circuit structure. For example, such a heat treatment step commonly accompanies a reflow operation in which a passivating layer between resistor 21 and an overlying metal region is smoothed. Of course, if desired, the out diffusion 24 may be caused immediately following deposition of the polycrystalline silicon 21 by an appropriate heat treatment at that time.

Figure 3A:
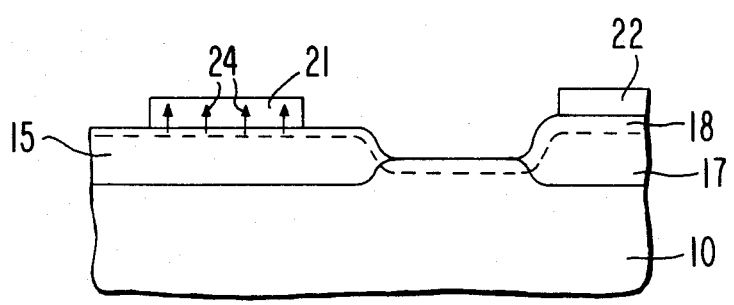
FIG. 3a illustrates an alternate embodiment of the invention in which the insulating regions are etched prior to deposition of the polycrystalline silicon.

An alternate embodiment of the invention is depicted in FIG. 3a. In that embodiment the desired impurity has been implanted to a depth such that out diffusion will not occur during subsequent processing, that is, because the subsequent process does not include a heat treatment step of sufficient temperature and/or duration. In this embodiment the polycrystalline silicon resistor 21 is fabricated by etching the field oxide 15 and removing enough material from its upper surface to allow out diffusion to occur during subsequent conventional process operations. In such an embodiment the polycrystalline silicon 22 deposited on field oxide 18 will not be doped, while that deposited on oxide 15 will be doped by the out diffusion. Thus, control over which portions of polycrystalline silicon become doped during the out diffusion is achievable. Furthermore, if desired, different doping concentrations in different resistors 21 scattered about the upper surface of the wafer may be achieved by etching the field oxide in those regions by the desired amount. For example, relatively more strongly doped resistors having lower resistances will be created where the field oxide is deeply etched, than where less deeply etched for a given implant depth.

For the structure depicted in FIG. 3 the implant energy has been chosen to be sufficiently high so that no out diffusion occurs unless a selected amount of field oxide 15 is removed to expose the dopant. The amount of the out diffusion to dope the polycrystalline silicon 21 is achieved by removing a controlled amount of the field oxide. With a dose of $6 \times 10^{15}$ arsenic atoms per square centimeter at 100 KeV, removing 300 Angstroms of field oxide will create a resistor value of 1 megaohm per square, while removing 450 Angstroms of silicon dioxide will result in a 100 K ohms per square resistor, both using the subsequent process described above in conjunction with FIG. 4.

In the foregoing description of the preferred embodiment of this invention certain parameters have been specified to explain the best mode of carrying out the invention, and to illustrate advantages which the invention provides over the prior art. These details should not be interpreted as limiting the invention which is defined by the scope of the appended claims.

We claim:
1. A method of fabricating a polycrystalline silicon resistor in a semiconductor structure while doping first regions in the semiconductor structure comprising:
    fabricating insulating material of first thickness over the first regions and of second greater thickness over second regions of the semiconductor structure;
    introducing at least one desired conductivity type dopant into the insulating material at the second regions, and at the same time through the insulating material into the semiconductor structure at the first regions;
    forming regions of undoped polycrystalline silicon on the insulating material of second greater thickness; and
    treating the semiconductor structure, including the regions of undoped polycrystalline silicon, to cause the dopant in the insulating material to diffuse into the polycrystalline silicon to thereby fabricate a polycrystalline silicon resistor.

2. A method as in claim 1 wherein step of treating comprises heating the semiconductor structure including the polycrystalline silicon.

3. A method as in claim 2 wherein the step of introducing at least one desired conductivity type dopant comprises implanting the dopant.

4. A method as in claim 3 wherein the step of fabricating insulating material over selected regions of the semiconductor structure comprises oxidizing the underlying semiconductor structure.

5. A method as in claim 3 wherein the step of implanting comprises implanting at least one material selected from the group of boron, arsenic, phosphorous, or antimony.

6. A method as in claim 1 wherein following the step of introducing at least one desired conductivity type dopant into the insulating material, the step of removing some of the insulating material is performed.

7. A method as in claim 6 wherein the step of removing some of the insulating material precedes the step of forming regions of undoped polycrystalline silicon.

8. A method as in claim 6 wherein during the step of treating the semiconductor structure only those impurities in regions of the insulating material beneath regions of the insulating material which have been removed diffuse into the polycrystalline silicon.

* * * * *